United States Patent
Lin

(10) Patent No.: US 7,483,306 B2
(45) Date of Patent: Jan. 27, 2009

(54) FAST AND ACCURATE SENSING AMPLIFIER FOR LOW VOLTAGE SEMICONDUCTOR MEMORY

(75) Inventor: Yung Feng Lin, Taoyuan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 11/670,626

(22) Filed: Feb. 2, 2007

(65) Prior Publication Data

US 2008/0186786 A1 Aug. 7, 2008

(51) Int. Cl.
*G11C 16/06* (2006.01)
*G11C 7/02* (2006.01)

(52) U.S. Cl. ............... 365/185.21; 365/207; 365/208
(58) Field of Classification Search ............. 365/185.21
See application file for complete search history.

(56) References Cited

U.S. PATENT DOCUMENTS

| | | | |
|---|---|---|---|
| 6,323,693 B1 * | 11/2001 | Park | 327/56 |
| 6,351,416 B2 * | 2/2002 | Fuchigami et al. | 365/185.21 |
| 6,473,343 B2 * | 10/2002 | Ohba et al. | 365/189.07 |
| 6,490,199 B2 | 12/2002 | Lee et al. | |
| 6,762,953 B2 | 7/2004 | Tanizaki et al. | |
| 6,822,906 B2 | 11/2004 | Confalonieri et al. | |
| 6,836,443 B2 * | 12/2004 | Dadashev | 365/189.07 |
| 6,898,124 B1 | 5/2005 | Wang et al. | |
| 6,954,102 B2 * | 10/2005 | Bedarida et al. | 327/539 |

OTHER PUBLICATIONS

Pathak, B., et al. "A 1.8V 64 Mb 100MHz Flexible Read While Write Flash Memory," 2001 IEEE ISSCC, 4 pages.

* cited by examiner

*Primary Examiner*—Son L Mai
(74) *Attorney, Agent, or Firm*—Warren S. Wolfeld; Haynes Beffel & Wolfeld LLP

(57) ABSTRACT

A memory sensing circuit and method that can achieve both a wide read margin and a fast read time. Roughly described, a target cell draws a target cell current from a first node when selected. The target cell current depends on the charge level stored in the target cell. A reference cell draws a reference cell current from a second node when selected, and a current difference generator generates into a third node a third current flow positively dependent upon the difference between the target cell current and the reference cell current. The current difference generator also generates into a fourth node a fourth current flow negatively dependent upon the difference between the target cell current and the reference cell current. A sense amplifier has its first input connected to the third node and a second input connected to the fourth node.

9 Claims, 7 Drawing Sheets

FAST AND ACCURATE SENSING AMPLIFIER FOR LOW VOLTAGE SEMICONDUCTOR MEMORY

BACKGROUND

The present invention relates to semiconductor memory devices, and more particularly to sensing schemes for such devices.

Memory devices are known in the art for storing data in a wide variety of electronic devices and applications. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit.

Typically, the state of a memory cell is determined during a read operation by sensing the current drawn by the memory cell. According to one particular embodiment, the current drawn by a particular memory cell is ascertained by connecting the drain terminal of the memory cell to a sensing circuit, where the source terminal of the memory cell is connected to ground, and the gate of the memory cell is selected. The sensing circuit attempts to detect the current drawn by the memory cell, by comparing the sensed memory cell current against a reference current. If the sensed memory cell current exceeds the reference current, the memory cell is considered an erased cell (e.g., corresponding to a "1" bit). If the sensed memory cell current is below the reference current, the memory cell is considered a programmed cell (e.g., corresponding to a "0" bit).

In practice, it is desirable to have the sensed memory cell current be greater than or less than the reference current by a sufficient margin (referred to herein as the "read margin" in the present application) so as to accurately identify the charge level stored by the memory cell. However, when high density memory devices are implemented with a low supply voltage ("VCC"), such as 1.8 volts, for example, the read margin is significantly reduced. When the read margin is significantly reduced, the reliability of sensing the memory cell current also decreases. The reliability and accuracy of the read operation are thus reduced, resulting in poor performance of the memory device.

Accordingly, there is a strong need in the art to overcome deficiencies of known sensing circuits and to provide a fast and accurate sensing circuit and technique for low voltage semiconductor memory devices.

SUMMARY

Roughly described, the invention involves a sensing circuit for a target memory cell, in which the target cell draws a target cell current from a first node in response to selection of the target cell. The target cell current depends on the charge level stored in the target cell. A reference cell draws a reference cell current from a second node in response to selection of the reference cell, and a current difference generator generates into a third node a third current flow positively dependent upon the difference between the target cell current and the reference cell current. The current difference generator also generates into a fourth node a fourth current flow negatively dependent upon the difference between the target cell current and the reference cell current. A sense amplifier has its first input connected to the third node and a second input connected to the fourth node. Embodiments of the invention can thus achieve both a wide read margin and a fast read time.

BRIEF DESCRIPTION OF THE DRAWINGS

The invention will be described with respect to particular embodiments thereof, and reference will be made to the drawings, in which.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
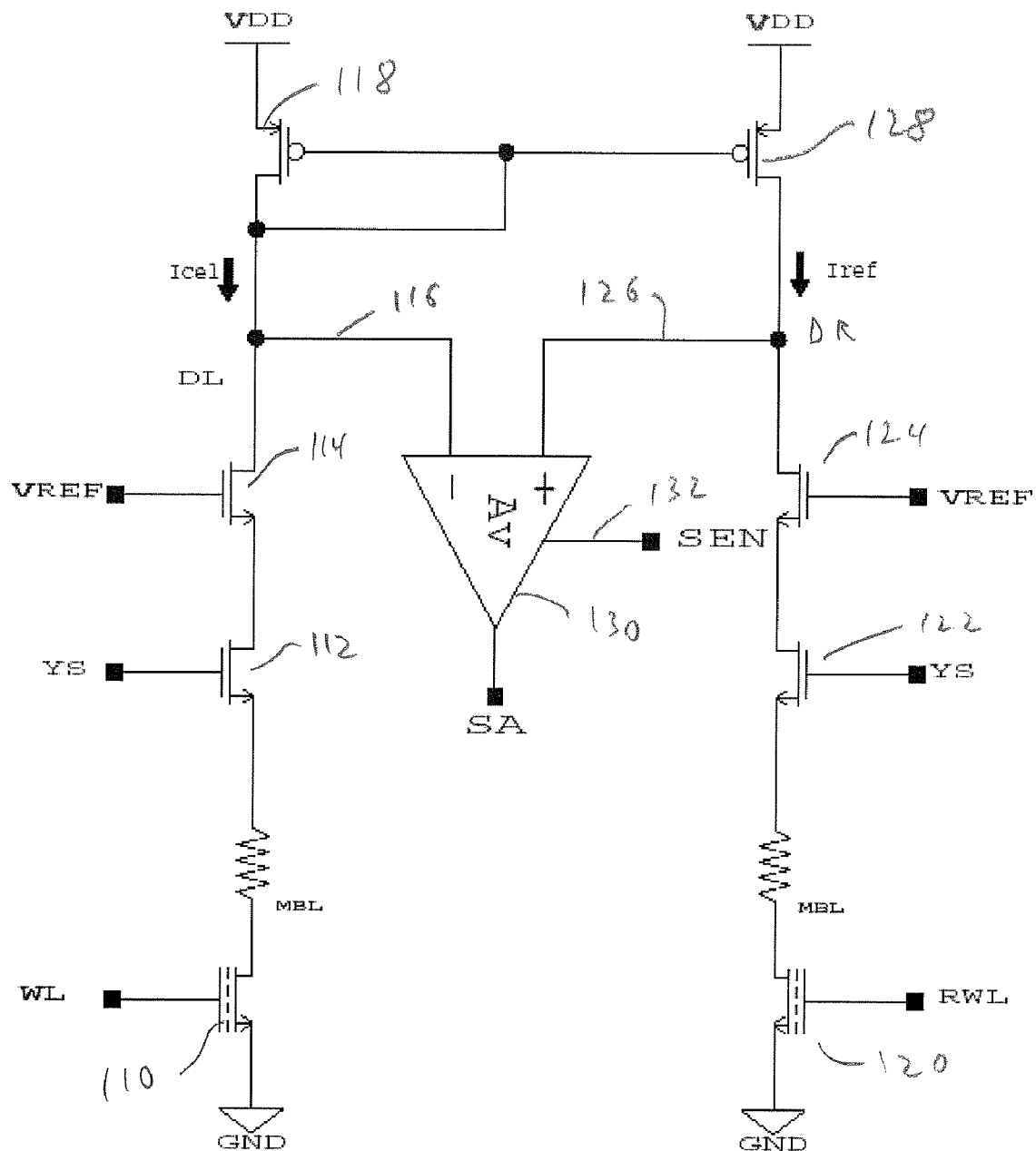
FIGS. 1 and 2 illustrate conventional sense amplifier arrangements.

FIG. 1 illustrates a conventional sense amplifier arrangement in which the drain terminal of a target nonvolatile memory cell 110 is cascode-connected through a selection transistor 112 with a bias transistor 114. The current Icell through the cascode combination is converted to a voltage DL at the drain 116 of the bias transistor 114, by PMOS active load transistor 118 connected between drain 116 and Vdd. On the reference side, the drain terminal of a reference cell 120 is cascode-connected through a selection transistor 122 with a bias transistor 124. The current Iref through the cascode combination is converted to a voltage DL at the drain 126 of the bias transistor 124, by a PMOS load transistor 128 which is connected in a current mirror arrangement with the transistor 118 on the target side. As long as Icell is stable, the voltage DL will be stable and the voltage DR will depend on the difference between Icell and Iref. The difference between the two voltages DL and DR is amplified by a second stage sense amplifier 130, triggered by a sense enable signal 132.

In a low supply voltage environment, however, the arrangement of FIG. 1 suffers from the problem that the read margin of the second stage sense amplifier 130 is reduced because of the need to operate both current mirror transistors 118 and 128 in the saturation region. This reduces the available voltage for DL on the higher end of the range, and flash cell drain bias requirements limit the available voltage on the lower end of the range. The narrow voltage swing results in a long waiting time for the sensing signal to build up to a magnitude that is sufficiently reliable to trigger the second stage sense amplifier 130.

Figure 2:
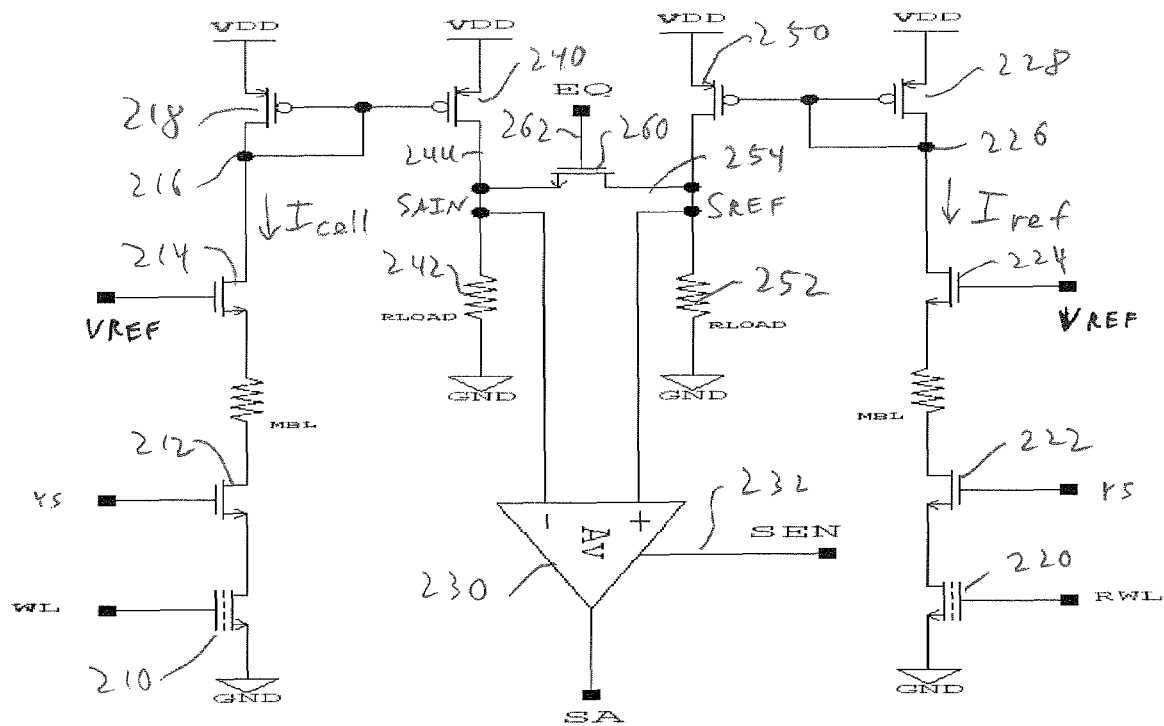

FIG. 2 illustrates a second conventional sense amplifier arrangement that alleviates the narrow voltage swing problem of FIG. 1. In the arrangement of FIG. 2, the series connection of transistors on the target side is roughly the same as that in FIG. 1, involving the target memory cell 210 cascode-connected through a selection transistor 212 with a bias transistor 214. The current Icell through the cascode combination is drawn from the drain 216 of a PMOS active load transistor 218 connected between drain 216 and Vdd. Similarly, the series connection of transistors on the reference side is also roughly the same as that in FIG. 1, involving the target memory cell 220 cascode-connected through a selection transistor 222 with a bias transistor 224. The current Iref through the cascode combination is drawn from the drain 226 of a PMOS active load transistor 228 connected between drain 226 and Vdd. On the target side, however, node 216 is not connected directly to the target side of second stage sense amplifier 230. Instead the load transistor 218 is connected in a current mirror arrangement with another transistor 240, which outputs a copy of Icell through a load resistance 242 to ground. The load resistance 242 converts the current to a voltage SAIN at the source node 244 of the transistor 240, and this is the voltage node that is provided to the target side of second stage sense amplifier 230. Similarly, on the reference side, node 226 is not connected directly to the reference side of second stage sense amplifier 230. Instead the load transistor 228 is connected in a current mirror arrangement with another transistor 250, which outputs a copy of Iref through another load resistance 252 to ground. The load resistance 252 converts the current to a voltage SREF at the source node 254 of the transistor 250, and this is the voltage node that is provided to the reference side of second stage sense amplifier 230. An equalization transistor 260 is also added, the control gate of which receives an EQ signal 262. Equalization transistor 260 equalizes the SAIN and SREF voltages prior to the start of the reading process.

The arrangement of FIG. 2 alleviates the problem of narrow voltage swing in low voltage environments not because of any increase in the available voltage for SAIN on the higher end of the range of available voltages, but because the flash cell drain bias requirements no longer limit the available voltage on the lower end of the range. The load resistance 242 also can be made large enough to amplify the voltage swing of SAIN in response to the swing of the current Icell. The same is true on the reference side. The transistors 240 and 250 also can be made larger (wider) than the corresponding transistors 218 and 228, so that the mirrored current driven into the resistances 242 and 252 are larger than Icell and Iref, respectively.

Figure 3:
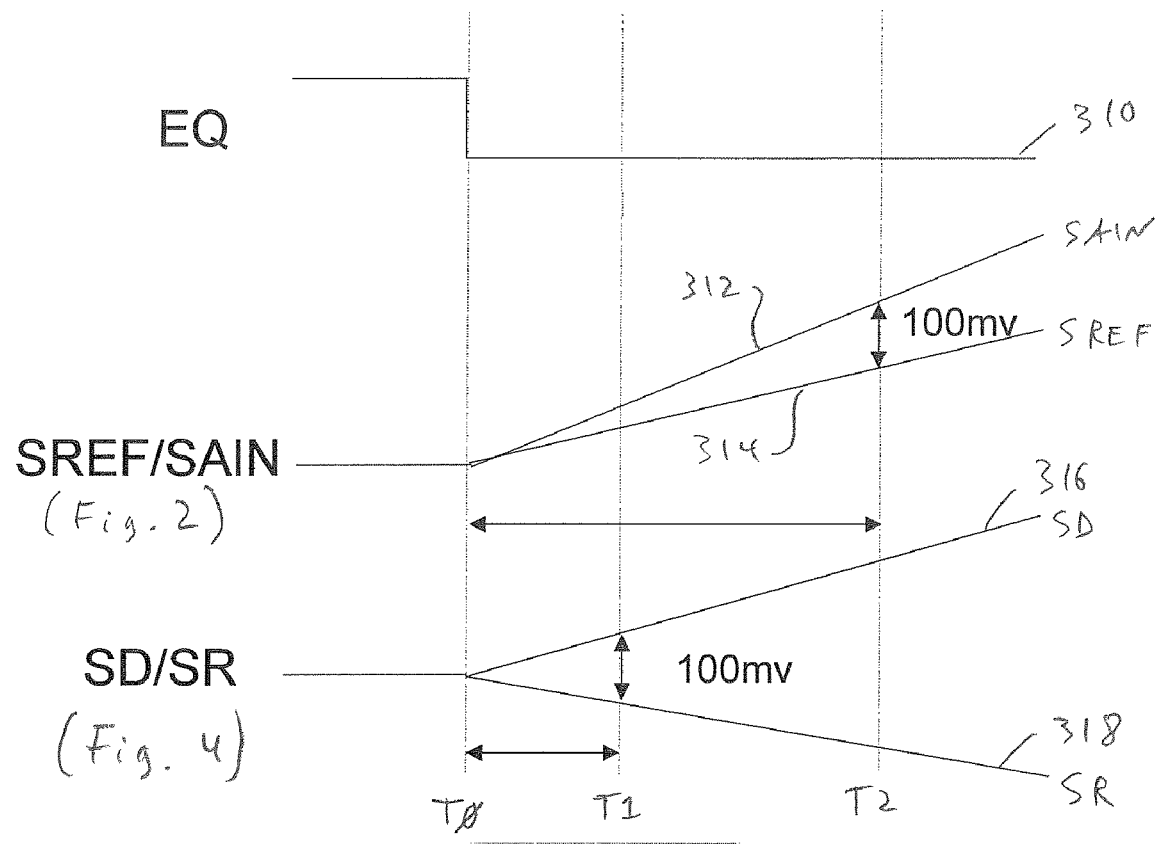
FIG. 3 illustrates voltage changes over time for the arrangements of FIGS. 2 and 4.

Although the FIG. 2 arrangement can provide increased read margin in the low voltage environment, typically it does so at the expense of a longer waiting time for sensing signal buildup. FIG. 3 illustrates the voltage changes over time after the EQ signal turns off and sensing begins. In the example of FIG. 3, the target cell is in its erased state. Curve 310 in FIG. 3 illustrates the EQ signal 262 turning off at a time T0. Curve 312 illustrates the subsequent voltage change for the voltage SAIN, and curve 314 illustrates the subsequent voltage change for the voltage SREF. Since the target cell 210 is in its erased state, Icell is larger than Iref, and SAIN moves toward a higher voltage than does SREF. But since both voltages start from an equalized voltage that is lower than the ultimate values of both SAIN and SREF, the trajectories of both voltages are in the same (upward) direction. If the criteria for sensing is for example 100 mV difference between SAIN and SREF, then the device has to wait until time T2 before the second stage sense amplifier 230 can be enabled. The same is true if the target cell is in its programmed state. The only difference would be that SAIN increases more slowly than SREF, toward an ultimate value that is below the ultimate value of SREF. The device still must wait until at least time T2 before the difference between the two signals reaches the required 100 mV difference.

Figure 4:
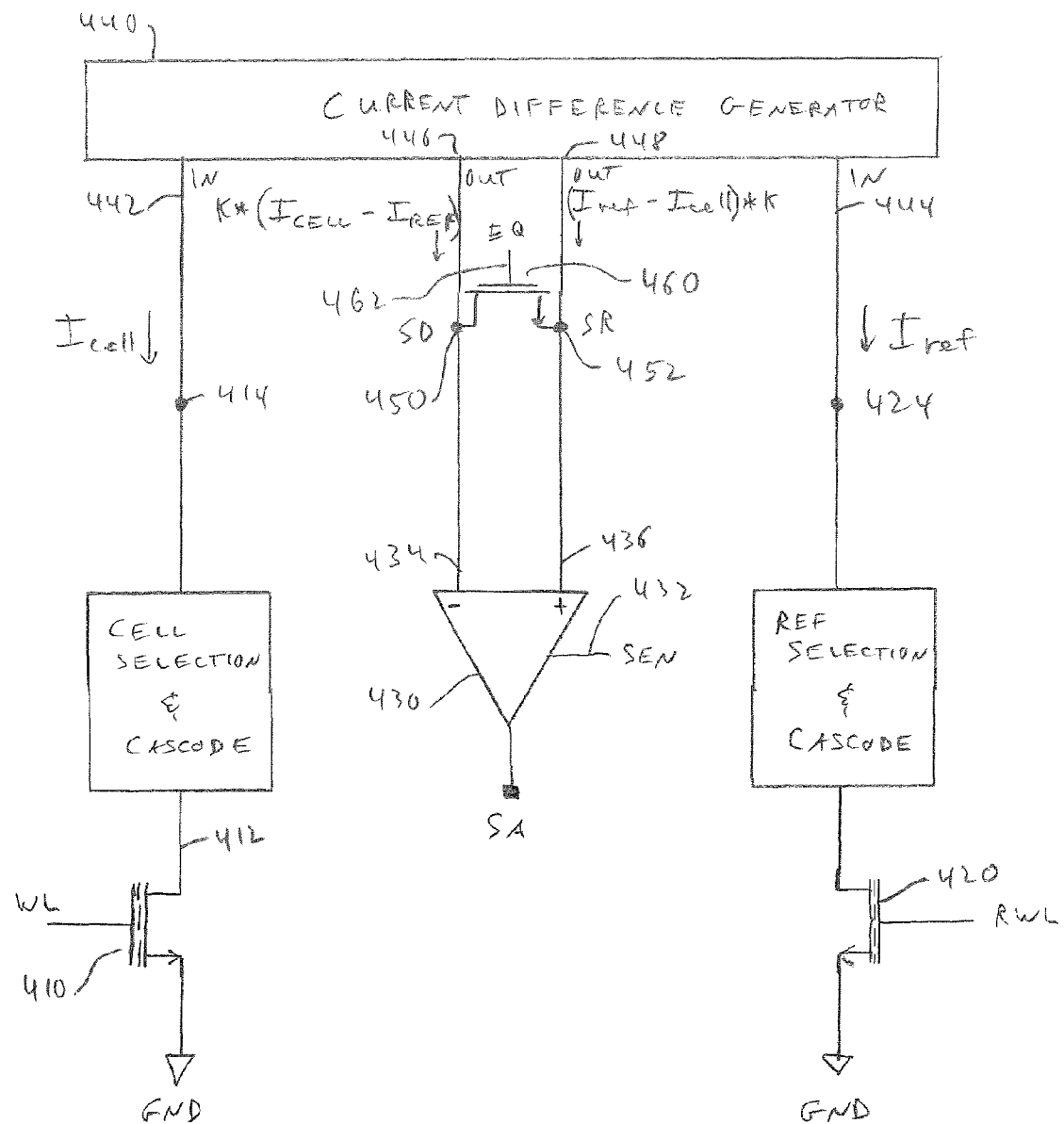
FIG. 4 illustrates a sense amplifier arrangement according to an embodiment of the invention.

FIG. 4 is an arrangement that alleviates the narrow voltage swing of the FIG. 1 arrangement without incurring the lengthy sensing signal buildup time of the FIG. 2 arrangement. In FIG. 4, the source of an N-channel target cell 410 is connected to ground. The drain 412 of target cell 410 is connected, through cell selection circuitry, optional cascode circuitry, as well as perhaps other circuitry, to a node 414, such that the cell 410 is drawing a current Icell from the node 414. The value of current Icell depends in the usual manner on the charge stored in the cell 410: if the cell is in its erased state, then the current Icell has a larger magnitude than if the cell is in its programmed state.

Similarly on the reference side, the source of an N-channel reference cell 420 is connected to ground. The drain 422 of this cell is connected, again through cell selection circuitry, optional cascode circuitry as well as perhaps other circuitry, to a node 424, such that the cell 420 is drawing a current Iref from the node 424. The value of the current Iref is, in the usual manner, in between the value drawn by target cell 410 when it is in the program state and the value drawn by target cell 410 when it is in the erased state.

The node 414 is connected to one input 442 of a current difference generator 440, and the node 424 is connected to a second input 444 of the current difference generator 440. The current difference generator 440 has an output 446 which carries a current that is positively dependent on the difference between the current on input terminal 442 and the current on input terminal 444. The current difference generator 440 also has a second output 448, which carries a current that is negatively dependent on the difference between the current on input terminal 442 and the current on input terminal 444. As used herein, an output current is "positively dependent" upon an input current if, throughout its operating range, an increase in the input current yields an increase in the output current; that is, there is no sign change. An output current is "negatively dependent" upon an input current if, throughout its operating range, an increase in the input current yields a decrease in the output current. Preferably in both cases in FIG. 4 the dependency is simply a constant of proportionality, and preferably both constants are equal. That is, Iout(446)=K (Icell−Iref), and Iout(448)=K(Iref−Icell). In one embodiment K=1 whereas in another embodiment K>1. A value of K>1 can further improve the reading speed, but it consumes more current from Vdd, requires certain transistors to occupy a larger chip area, and complicates layout matching issues. However, other acceptable types of positive or negative dependencies will be apparent to the reader.

The output terminal 446 of current difference generator 440 is connected to an SD node 450, which is connected to the inverting input 434 of a second stage sense amplifier 430. Similarly, the output terminal 448 of the current difference generator 440 is connected to an SR node 452, which is connected to the non-inverting input 436 of the second stage sense amplifier 430. The second stage a sense amplifier 430 has a high equivalent input impedance on its inverting input 434, which effectively converts the current flowing into node 450 into a voltage. Similarly, the second stage sense amplifier 430 has a high equivalent input impedance on its non-inverting input 436, which effectively converts the current flowing into node 452 into a voltage. The second stage sense amplifier 430 also has a sense enable input, in response to which the amplifier 430 will amplify the difference between the voltages on its two inputs. The circuit of FIG. 4 also includes an equalization transistor 460 connected between SD node 450 and SR node 452, so as to equalize the voltages on the two nodes, prior to sensing, in response to a signal on its gate terminal 462.

Returning to FIG. 3, curve 316 illustrates the movement of the voltage on SD node 450 after removal of the equalization signal, in a situation where target cell 410 is in its erased state. Curve 318 illustrates the movement of the voltage on SR node 452 in the same situation. If the target cell 410 were in its programmed state, and the two curves would be interchanged.

It can be seen that because the current flowing into each of the two nodes is the opposite of the current flowing into the other, the two voltages move in opposite directions, one increasing of the other decreasing during sensing signal buildup. Thus if the criteria for sensing is 100 mV, as it was for the FIG. 2 arrangement, the difference between the SD and SR voltages reaches this value at a time T1, which is much sooner than T2. The sensing operation can therefore be much quicker in the arrangement of FIG. 4 than in the arrangement of FIG. 2, all other things being equal. And as mentioned, the sensing operation can be made even quicker by designing a larger value of K, if the downsides mentioned above of the larger value of K can be tolerated.

Figure 5:
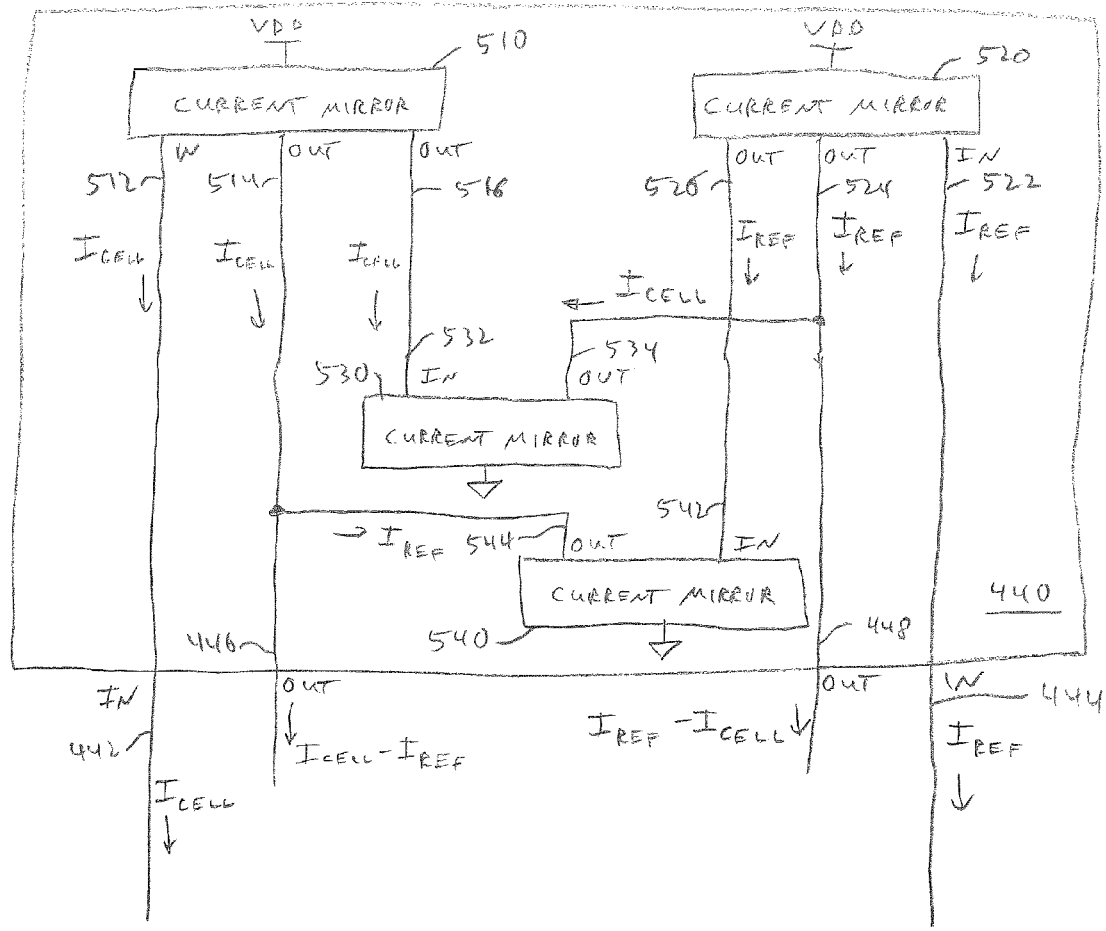
FIG. 5 illustrates an embodiment of the current difference generator in FIG. 4.

The current difference generator 440 can be designed using a variety of different kinds of circuitry, as will be apparent to the reader. FIG. 5 illustrates a preferred embodiment of current difference generator 440. It includes two P-channel current mirrors 510 and 520 and two N-channel current mirrors 530 and 540. Current mirror 510 has an input 512 connected to input terminal 442 of the current difference generator 440, and an output 514 connected to output terminal 446 of the current difference generator 440. Current mirror 510 also has a second output 516 that is connected to an input 532 of N-channel current mirror 530. Similarly, current mirror 520 has an input terminal 522 connected to input terminal 444 of the current difference generator 440, and an output 524 connected to output 448 of current difference generator 440. Current mirror 520 also has a second output 526 connected to an input 542 of N-channel current mirror 540. N-channel current mirror 530 further has an output 534 connected to the output terminal 448 of the current difference generator 440, and the current mirror 540 further has an output terminal 544 connected to the output terminal 446 of the current difference generator 440. All the current mirrors are designed to replicate on their outputs the same current magnitude as provided on their inputs. It will be appreciated that in other embodiments, current mirrors can be used that generate output currents which depend by a different relationship on the input current magnitudes. For example, if it is desired to implement K>1, then each of the current mirrors 510 and 520 can be designed to drive each of their outputs with K times their respective input current Icell or Iref.

As used herein, a current value can be positive or negative, and depends on an arbitrarily defined current flow "direction". That is, a positive current flow from a node A toward a node B in a circuit is the same as a negative current flow from node B toward node A. Similarly, when current is said to be "drawn from" a particular node, this language by itself does not require that the current be positive when drawn from the particular node. The current "drawn from" the particular node can be negative, which would be the same as saying that a positive current is flowing into the particular node. In the same way, nor does a current said to be "driven into" a particular node require that the current be positive when driven into the particular node. Finally, the labeling of a current mirror terminal as an "input" or an "output" does not define either its current flow direction or its current flow sign. It merely differentiates between controlling terminals (labeled "inputs") and controlled terminals (labeled "outputs").

In operation, N-channel current mirror 540 draws into its output 544 current equal to the reference cell current Iref. This current is drawn from the output terminal 446 of current difference generator 440, which also receives a current equal to the target cell current Icell. Thus the current flowing into SD node 450 (FIG. 4) is equal to the difference between the two current levels, Icell−Iref. Similarly, N-channel current mirror 530 draws into its output 534 current equal to the target cell current Icell. This current is drawn from the output terminal 448 of current difference generator 440, which also receives a current equal to the reference cell current Iref. Thus the current flowing into SR node 452 (FIG. 4) is equal to the difference between the two current levels, Iref−Icell, which is the negative of the current flowing into SD node 450.

Figure 6:
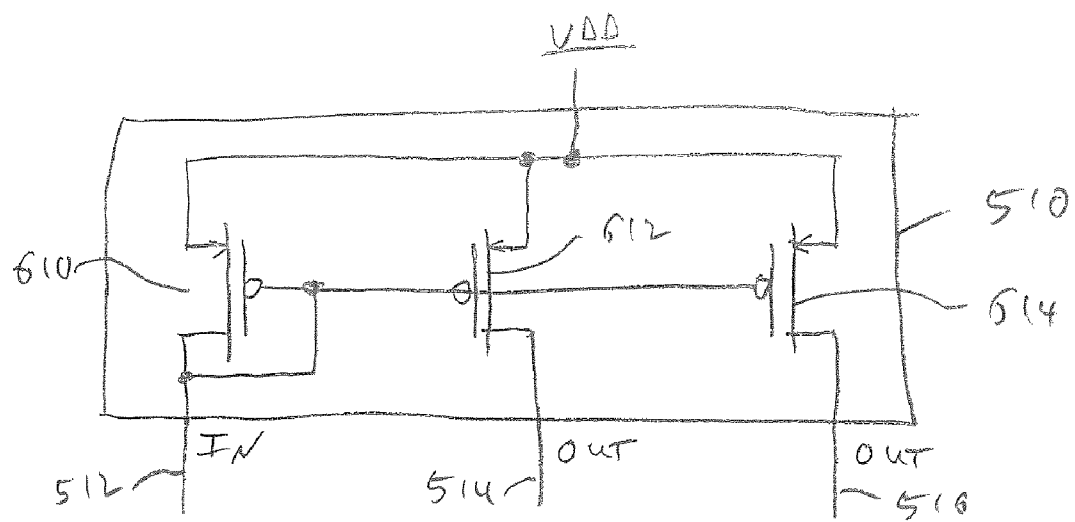
FIGS. 6 and 7 illustrate embodiments of current mirrors in the current difference generator of FIG. 5.

The P-channel current mirrors 510 and 520 can be designed using a variety of different kinds of circuitry, as will be apparent to the reader. FIG. 6 illustrates a preferred embodiment of current mirror 510. Current mirror 520 is similar. Referring to FIG. 6, current mirror 510 includes three P-channel transistors 610, 612 and 614. The source terminals of all three transistors are connected together and to the power supply voltage Vdd. The gate terminals of all three transistors are connected together and to the drain terminal of transistor 610. The drain terminal of transistor 610 is also connected to the input terminal 512 of current mirror 510. Similarly, the drain terminals of transistors 612 and 614 are connected respectively to the output terminals 514 and 516 of current mirror 510. The geometries of the three transistors 610, 612 and 614 are matched so that current flowing into the input terminal 512 is mirrored on each of the output terminals 514 and 516. Non-unity constants of proportionality (K) can be implemented if desired in a particular embodiment, using well-known variations in the transistor geometries.

Figure 7:
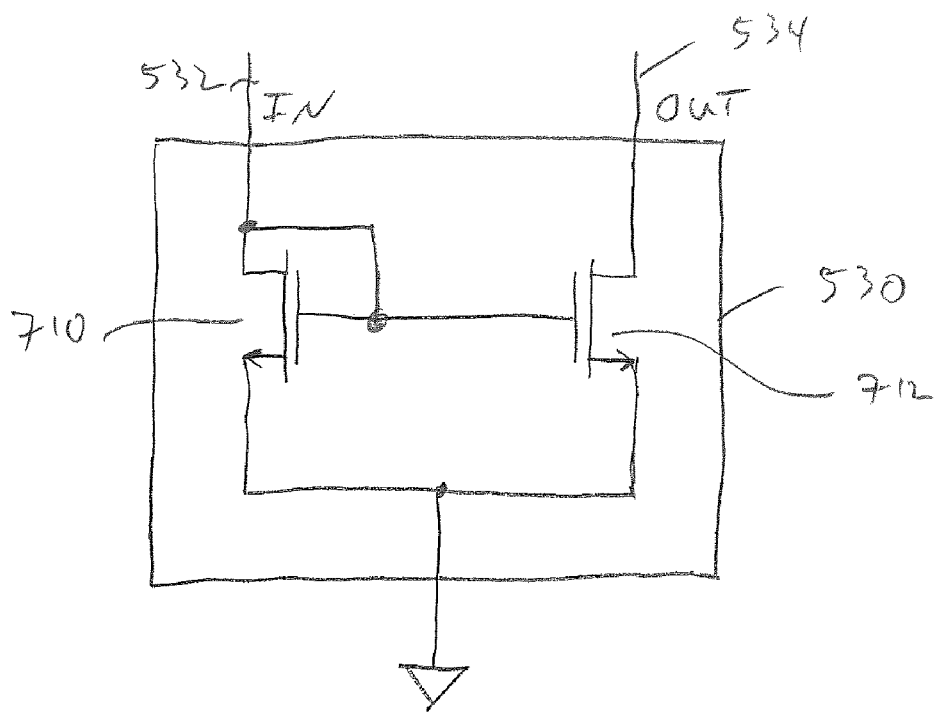

The N-channel current mirrors 530 and 540 also can be designed using a variety of different kinds of circuitry, as will be apparent to the reader. FIG. 7 illustrates a preferred embodiment of current mirror 530. Current mirror 540 is similar. Referring to FIG. 7, current mirror 530 includes two N-channel transistors 710 and 712. The source terminals of both transistors are connected together and to ground, and the gate terminals of both transistors are connected together and to the drain of transistor 710. The drain of transistor 710 is also connected to input terminal 532 of the current mirror 530, and the drain of transistor 712 is connected to the output terminal 534 of current mirror 530. The geometries of the two transistors and 710 and 712 are matched so that current flowing into the input terminal 532 is mirrored on the output terminal 534. As with the P-channel current mirrors 510 and 520, non-unity constants of proportionality can be implemented if desired in a particular embodiment, using well-known variations in the transistor geometries.

Figure 8:
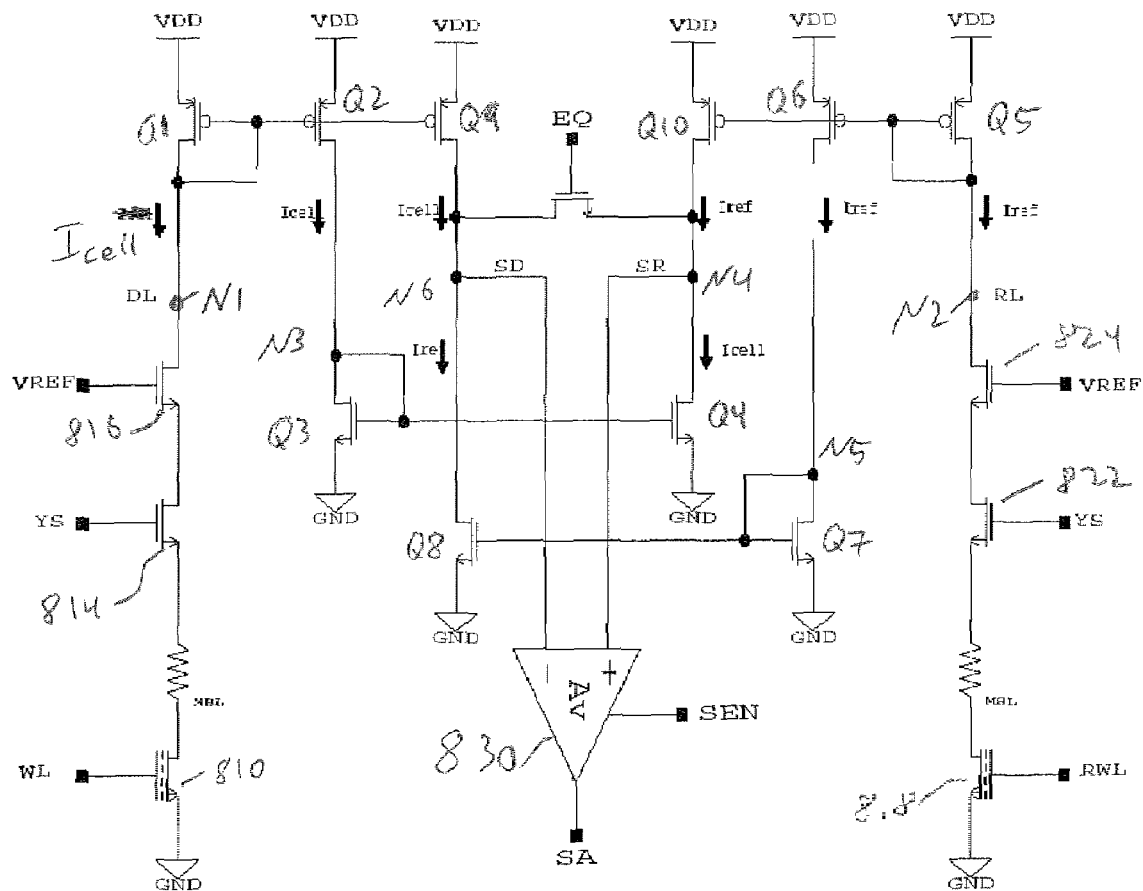
FIG. 8 is a circuit diagram of an embodiment of the invention.

FIG. 8 is a circuit diagram of an embodiment of the invention, showing the various components together. It includes a target memory cell 810 having a drain connected to a node N1 through selection circuitry 814 and bias transistor 816. The target memory cell 810 draws a target memory cell current Icell from node N1 when activated during a read operation. A reference memory cell 818 has its drain connected to a second node N2 through another selection circuit 822 and another bias transistor 824. The reference memory cell 818 draws a reference memory cell current Iref from node N2 when activated during the read operation. The circuit includes a current mirror including two transistors Q1 and Q2, the target memory cell current Icell flowing separately from drains of these two transistors into respectively the node N1 and a node N3. Another current mirror includes transistors Q3 and Q4, the target memory cell current Icell flowing separately from the node N3 and another node N4 to drains of the transistors Q3 and Q4. The sources of transistors Q3 and Q4 are connected to ground. Another current mirror includes transistors Q5 and Q6, the reference memory cell current Iref flowing separately from drains of transistors Q5 and Q6 respectively to the node N2 and to another node N5. Another current mirror includes transistors Q7 and Q8, the reference memory cell current Iref flowing separately from node N5 and another node N6 into drains of the transistors Q7 and Q8. The sources of the transistors Q7 and Q8 are both connected to ground. Another transistor Q9 and the transistor Q1 form yet another current mirror, the target memory cell current Icell flowing from a drain of the transistor Q9 to the node N6. Another transistor Q10 and the transistor Q5 form yet another current mirror, the reference memory cell current Iref flowing from a drain of the transistor Q10 to the node N4. The circuit further includes a sense amplifier 830 having first and second inputs connected respectively to the nodes N6 and N4. It can be seen that in the circuit of FIG. 8, the difference between the target memory cell current Icell and reference memory cell current Iref flows in opposite signs into respectively the first and second inputs of sense amplifier 830. In addition, it will be appreciated that a non-unity value of K can be implemented by an appropriate variation in the geometries of transistors Q2 and Q9 relative to that of transistor Q1, and by an appropriate variation in the geometries of transistors Q6 and Q10 relative to that of transistor Q5. For example, transistors Q2 and Q9 can be made with a channel width that is K times that of transistor Q1, and transistors Q6 and Q10 can be made with a channel width that is K times that of transistor Q5.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, the invention may also be viewed as a method for sensing a charge level on a target memory cell, by performing the steps that are performed by the circuitry described herein. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

I claim:

1. A sensing circuit for a target memory cell, the target cell drawing a target cell current from a first node in response to selection of the target cell, the target cell current being dependent upon a charge level stored in the target cell, comprising:
   a reference cell drawing a reference cell current from a second node in response to selection of the reference cell;
   a current difference generator generating a third current flow into a third node, and generating a fourth current flow into a fourth node; and
   a sense amplifier having a first input connected to the third node and a second input connected to the fourth node,
   wherein the current difference generator comprises:
   a first current mirror having an input and first and second outputs, the input being connected to the first node and the first output being connected to the third node;
   a second current mirror having an input and a first and second outputs, the input of the second current mirror being connected to the second node and the first output of the second current mirror being connected to the fourth node;
   a third current mirror having an input connected to the second output of the first current mirror and an output connected to the fourth node; and
   a fourth current mirror having an input connected to the second output of the second current mirror and an output connected to the third node.

2. A sensing circuit according to claim 1, further comprising an equalization mechanism which, in response to an equalization signal, equalizes the voltages on the third and fourth nodes.

3. A sensing circuit according to claim 1, wherein each of the current mirrors are such that the current flow magnitude on each of its outputs equals the current flow magnitude on its input.

4. A sensing circuit according to claim 1, wherein the third current flow generated by the current difference generator is equal to the target cell current minus the reference cell current, and wherein the fourth current flow generated by the current difference generator is equal to the reference cell current minus the target cell current.

5. A sensing circuit according to claim 1, wherein the third current flow generated by the current difference generator is given by:

$$K*(Icell-Iref),$$

and wherein the fourth current flow generated by the current difference generator is given by:

$$K*(Iref-Icell),$$

where Icell is the target cell current, Iref is the reference cell current, and K is a value greater than 1.

6. A sensing circuit for a target memory cell, the target memory cell having a drain connected to a first node through a first selection circuit during a read operation involving the target memory cell, the target memory cell drawing a target memory cell current when activated during the read operation, comprising:
   a reference memory cell having a drain connected to a second node through a second selection circuit, the reference memory cell drawing a reference memory cell current when activated during the read operation;
   a first current mirror including first and second transistors, the target memory cell current outputted separately from drains of the first and second transistors to the first node and a third node;
   a second current mirror including third and fourth transistors, the target memory cell current outputted separately from the third node and a fourth node to drains of the third and fourth transistors, and sources of the third and fourth transistors connected to ground;
   a third current mirror including fifth and sixth transistors, the reference memory cell current outputted separately from drains of the fifth and sixth transistors to the second node and a fifth node;
   a fourth current mirror including seventh and eighth transistors, the reference memory cell current outputted separately from the fifth node and a sixth node to drains of the seventh and eighth transistors, and sources of the seventh and eighth transistors connected to ground;

a ninth transistor and the first transistor forming a fifth current mirror, the target memory cell current outputted from a drain of the ninth transistor to the sixth node;

a tenth transistor and the fifth transistor forming a sixth current mirror, the reference memory cell current outputted from a drain of the tenth transistor to the fourth node; and a sense amplifier having first and second inputs connected to the sixth and fourth nodes.

7. A method for sensing a charge level on a target memory cell, comprising the steps of:

drawing a target cell current from a first node in response to selection of the target cell, the target cell current being dependent upon a charge level stored in the target cell;

drawing a reference cell current from a second node in response to selection of the reference cell;

generating into a third node a third current flow positively dependent upon the difference between the target cell current and the reference cell current;

generating into a fourth node a fourth current flow negatively dependent upon the difference between the target cell current and the reference cell current;

converting a current dependent upon the third current flow, to a first voltage;

converting a current dependent upon the fourth current flow, to a second voltage; and amplifying a difference between the first and second voltages, wherein the third current flow generated in the step of generating into a third node, is given by:

$K*(Icell-Iref)$, and wherein the fourth current flow generated in the step of generating into a fourth node, is given by:

$K*(Iref-Icell)$, where Icell is the target cell current, Iref is the reference cell current, and K is a value greater than 1.

8. A method according to claim 7, further comprising the step of equalizing the voltages on the third and fourth nodes prior to the steps of generating into a third node and generating into a fourth node.

9. A method according to claim 7, wherein the third current flow generated in the step of generating into a third node, is equal to the target cell current minus the reference cell current, and wherein the fourth current flow generated in the step of generating into a fourth node, is equal to the reference cell current minus the target cell current.

* * * * *